United States Patent
McCormack et al.

(10) Patent No.: US 8,909,135 B2
(45) Date of Patent: Dec. 9, 2014

(54) WIRELESS COMMUNICATION WITH DIELECTRIC MEDIUM

(75) Inventors: Gary D. McCormack, Tigard, OR (US); Ian A. Kyles, West Linn, OR (US)

(73) Assignee: Keyssa, Inc., Mountain View, CA (US)

( * ) Notice: Subject to any disclaimer, the term of this patent is extended or adjusted under 35 U.S.C. 154(b) by 224 days.

(21) Appl. No.: 13/618,138

(22) Filed: Sep. 14, 2012

(65) Prior Publication Data

US 2013/0070817 A1   Mar. 21, 2013

Related U.S. Application Data

(60) Provisional application No. 61/535,277, filed on Sep. 15, 2011, provisional application No. 61/570,709, filed on Dec. 14, 2011, provisional application No. 61/592,491, filed on Jan. 30, 2012.

(51) Int. Cl.
*H04B 7/24* (2006.01)
(Continued)

(52) U.S. Cl.
CPC ........ *H04B 1/18* (2013.01); *H05K 2201/10522* (2013.01);
(Continued)

(58) Field of Classification Search
USPC ............ 455/41.2, 333, 39, 90.1, 73; 257/728; 333/239; 343/905
See application file for complete search history.

(56) References Cited

U.S. PATENT DOCUMENTS

| | | |
|---|---|---|
| 3,796,831 A | 3/1974 | Bauer |
| 4,485,312 A | 11/1984 | Kusakabe et al. |

(Continued)

FOREIGN PATENT DOCUMENTS

| | | |
|---|---|---|
| EP | 0 515 187 A2 | 11/1992 |
| EP | 1 298 809 A2 | 4/2003 |

(Continued)

OTHER PUBLICATIONS

Office of Engineering and Technology Federal Communications Commission, "Understanding the FCC Regulations for Low-Power, Non-Licensed Transmitters", OET Bulletin No. 63, Oct. 1993, 34 pages.

(Continued)

*Primary Examiner* — Sonny Trinh
(74) *Attorney, Agent, or Firm* — Fenwick & West LLP

(57) ABSTRACT

An electronic device may include a dielectric substrate, an electronic circuit supported by the substrate, for processing data, and a communication unit having an antenna. The communication unit may be mounted to the substrate in communication with the electronic circuit for converting between a first EHF electromagnetic signal containing digital information and a data signal conducted by the electronic circuit. The electromagnetic signal may be transmitted or received along a signal path by the antenna. An electromagnetic signal guide assembly may include a dielectric element made of a dielectric material disposed proximate the antenna in the signal path. The electromagnetic signal guide may have sides extending along the signal path. A sleeve element may extend around the dielectric element along sides of the dielectric element. The sleeve element may impede transmission of the electromagnetic signal through the sides of the dielectric element.

28 Claims, 9 Drawing Sheets

(51) Int. Cl.

| | | |
|---|---|---|
| *H04B 1/18* | (2006.01) | |
| *H01Q 7/00* | (2006.01) | |
| *H01L 23/495* | (2006.01) | |
| *H05K 1/02* | (2006.01) | |
| *H04B 5/00* | (2006.01) | |
| *H01Q 9/26* | (2006.01) | |
| *H05K 1/14* | (2006.01) | |
| *H01L 23/48* | (2006.01) | |
| *H01Q 23/00* | (2006.01) | |
| *H01L 23/00* | (2006.01) | |
| *H05K 1/18* | (2006.01) | |
| *H01L 23/66* | (2006.01) | |

(52) U.S. Cl.
CPC ..... *H05K 9/056* (2013.01); *H01L 2224/32225* (2013.01); *H01L 2223/6677* (2013.01); *H01L 2924/10253* (2013.01); *H01Q 7/00* (2013.01); *H01L 2924/3011* (2013.01); *H01L 2224/16245* (2013.01); *H01L 24/73* (2013.01); *H01L 23/495* (2013.01); *H01L 2924/15311* (2013.01); *H01L 2924/14* (2013.01); *H01L 24/48* (2013.01); *H05K 1/0243* (2013.01); *H01L 24/16* (2013.01); *H01L 2224/73265* (2013.01); *H05K 1/181* (2013.01); *H04B 5/0031* (2013.01); *H01L 2224/48227* (2013.01); *H01Q 9/265* (2013.01); *H01L 2224/32245* (2013.01); *H05K 1/144* (2013.01); *H01L 2224/48247* (2013.01); *H01L 23/66* (2013.01); *H01L 23/48* (2013.01); *H05K 2201/0723* (2013.01); *H01Q 23/00* (2013.01); *H01L 24/32* (2013.01); *H04B 5/0037* (2013.01)
USPC .......................................... 455/39; 455/41.2

(56) References Cited

U.S. PATENT DOCUMENTS

| | | | |
|---|---|---|---|
| 4,497,068 | A | 1/1985 | Fischer |
| 4,694,504 | A | 9/1987 | Porter et al. |
| 5,543,808 | A | 8/1996 | Feigenbaum et al. |
| 5,621,913 | A | 4/1997 | Tuttle et al. |
| 5,754,948 | A | 5/1998 | Metze |
| 5,773,878 | A | 6/1998 | Lim et al. |
| 5,956,626 | A | 9/1999 | Kaschke et al. |
| 6,351,237 | B1 | 2/2002 | Martek et al. |
| 6,490,443 | B1 | 12/2002 | Freeny, Jr. |
| 6,492,973 | B1 | 12/2002 | Kuroki et al. |
| 6,534,784 | B2 | 3/2003 | Eliasson et al. |
| 6,542,720 | B1 | 4/2003 | Tandy |
| 6,590,544 | B1 | 7/2003 | Filipovic |
| 6,607,136 | B1 | 8/2003 | Atsmon et al. |
| 6,718,163 | B2 | 4/2004 | Tandy |
| 6,915,529 | B1 | 7/2005 | Suematsu et al. |
| 6,967,347 | B2 | 11/2005 | Estes et al. |
| 7,107,019 | B2 | 9/2006 | Tandy |
| 7,213,766 | B2 | 5/2007 | Ryan et al. |
| 7,311,526 | B2 | 12/2007 | Rohrbach et al. |
| 7,512,395 | B2 | 3/2009 | Beukema et al. |
| 7,517,222 | B2 | 4/2009 | Rohrbach et al. |
| 7,593,708 | B2 | 9/2009 | Tandy |
| 7,598,923 | B2 | 10/2009 | Hardacker et al. |
| 7,599,427 | B2 | 10/2009 | Bik |
| 7,612,630 | B2 | 11/2009 | Miller |
| 7,617,342 | B2 | 11/2009 | Rofougaran |
| 7,645,143 | B2 | 1/2010 | Rohrbach et al. |
| 7,656,205 | B2 | 2/2010 | Chen et al. |
| 7,664,461 | B2 | 2/2010 | Rofougaran et al. |
| 7,760,045 | B2 | 7/2010 | Kawasaki |
| 7,761,092 | B2 | 7/2010 | Desch et al. |
| 7,768,457 | B2 | 8/2010 | Pettus et al. |
| 7,769,347 | B2 | 8/2010 | Louberg et al. |
| 7,778,621 | B2 | 8/2010 | Tandy |
| 7,791,167 | B1 | 9/2010 | Rofougaran |
| 7,820,990 | B2 | 10/2010 | Schroeder et al. |
| 7,889,022 | B2 | 2/2011 | Miller |
| 7,907,924 | B2 | 3/2011 | Kawasaki |
| 7,929,474 | B2 | 4/2011 | Pettus et al. |
| 8,014,416 | B2 | 9/2011 | Ho et al. |
| 8,036,629 | B2 | 10/2011 | Tandy |
| 8,041,227 | B2 | 10/2011 | Holcombe et al. |
| 8,063,769 | B2 | 11/2011 | Rofougaran |
| 8,081,699 | B2 | 12/2011 | Siwiak et al. |
| 8,087,939 | B2 | 1/2012 | Rohrbach et al. |
| 8,121,542 | B2 | 2/2012 | Zack et al. |
| 8,183,935 | B2 | 5/2012 | Milano et al. |
| 8,244,179 | B2 | 8/2012 | Dua |
| 8,279,611 | B2 | 10/2012 | Wong et al. |
| 8,339,258 | B2 | 12/2012 | Rofougaran |
| 2004/0214621 | A1 | 10/2004 | Ponce De Leon et al. |
| 2005/0140436 | A1 | 6/2005 | Ichitsubo et al. |
| 2006/0038168 | A1* | 2/2006 | Estes et al. ............ 257/25 |
| 2006/0159158 | A1 | 7/2006 | Moore et al. |
| 2007/0024504 | A1 | 2/2007 | Matsunaga |
| 2007/0063056 | A1 | 3/2007 | Gaucher et al. |
| 2007/0229270 | A1 | 10/2007 | Rofougaran |
| 2007/0278632 | A1 | 12/2007 | Zhao et al. |
| 2008/0089667 | A1 | 4/2008 | Grady et al. |
| 2008/0112101 | A1 | 5/2008 | McElwee et al. |
| 2008/0150799 | A1 | 6/2008 | Hemmi et al. |
| 2008/0150821 | A1 | 6/2008 | Koch et al. |
| 2008/0159243 | A1 | 7/2008 | Rofougaran |
| 2008/0192726 | A1 | 8/2008 | Mahesh et al. |
| 2008/0195788 | A1 | 8/2008 | Tamir et al. |
| 2008/0290959 | A1 | 11/2008 | Ali et al. |
| 2009/0006677 | A1 | 1/2009 | Rofougaran |
| 2009/0009337 | A1 | 1/2009 | Rofougaran |
| 2009/0037628 | A1 | 2/2009 | Rofougaran |
| 2009/0075688 | A1 | 3/2009 | Rofougaran |
| 2009/0094506 | A1 | 4/2009 | Lakkis |
| 2009/0175323 | A1 | 7/2009 | Chung |
| 2009/0218407 | A1 | 9/2009 | Rofougaran |
| 2009/0218701 | A1 | 9/2009 | Rofougaran |
| 2009/0236701 | A1 | 9/2009 | Sun et al. |
| 2009/0239392 | A1 | 9/2009 | Sumitomo et al. |
| 2009/0239483 | A1 | 9/2009 | Rofougaran |
| 2009/0245808 | A1 | 10/2009 | Rofougaran |
| 2009/0280765 | A1 | 11/2009 | Rofougaran et al. |
| 2010/0127804 | A1 | 5/2010 | Vouloumanos |
| 2010/0159829 | A1 | 6/2010 | McCormack |
| 2010/0202499 | A1 | 8/2010 | Lee et al. |
| 2010/0231452 | A1 | 9/2010 | Babakhani et al. |
| 2010/0277394 | A1 | 11/2010 | Haustein et al. |
| 2010/0283700 | A1 | 11/2010 | Rajanish et al. |
| 2010/0285634 | A1 | 11/2010 | Rofougaran |
| 2010/0297954 | A1 | 11/2010 | Rofougaran et al. |
| 2011/0047588 | A1 | 2/2011 | Takeuchi et al. |
| 2011/0181484 | A1 | 7/2011 | Pettus et al. |
| 2011/0207425 | A1 | 8/2011 | Juntunen et al. |
| 2011/0285606 | A1 | 11/2011 | De Graauw et al. |
| 2011/0286703 | A1 | 11/2011 | Kishima et al. |
| 2011/0311231 | A1 | 12/2011 | Ridgway et al. |
| 2012/0028582 | A1 | 2/2012 | Tandy |
| 2012/0064664 | A1 | 3/2012 | Yamazaki et al. |
| 2012/0069772 | A1 | 3/2012 | Byrne et al. |
| 2012/0083137 | A1 | 4/2012 | Rohrbach et al. |
| 2012/0263244 | A1 | 10/2012 | Kyles et al. |
| 2012/0286049 | A1 | 11/2012 | McCormack et al. |
| 2012/0290760 | A1 | 11/2012 | McCormack et al. |
| 2012/0295539 | A1 | 11/2012 | McCormack et al. |
| 2012/0307932 | A1 | 12/2012 | McCormack et al. |
| 2012/0319496 | A1 | 12/2012 | McCormack et al. |
| 2012/0319890 | A1 | 12/2012 | McCormack et al. |
| 2013/0070817 | A1 | 3/2013 | McCormack et al. |
| 2013/0106673 | A1 | 5/2013 | McCormack et al. |
| 2013/0109303 | A1 | 5/2013 | McCormack et al. |
| 2013/0157477 | A1 | 6/2013 | McCormack |
| 2013/0183903 | A1 | 7/2013 | McCormack et al. |

FOREIGN PATENT DOCUMENTS

| | | |
|---|---|---|
| EP | 2 309 608 A1 | 4/2011 |
| EP | 2 360 923 A1 | 8/2011 |
| WO | 2011/114737 A1 | 9/2011 |
| WO | 2011/114738 A1 | 9/2011 |
| WO | 2012/129426 A3 | 9/2012 |
| WO | 2012/155135 A3 | 11/2012 |
| WO | 2012/166922 A1 | 12/2012 |
| WO | 2012/174350 A1 | 12/2012 |
| WO | 2013/006641 A3 | 1/2013 |
| WO | 2013/040396 A1 | 3/2013 |
| WO | 2013/059801 A1 | 4/2013 |
| WO | 2013/059802 A1 | 4/2013 |
| WO | 2013/090625 A1 | 6/2013 |

OTHER PUBLICATIONS

Vahle Electrification Systems, "CPS Contactless Power System", Catalog No. 9d/E, 2004, 12 pages.

Future Technology Devices International Limited (FTDI), "Technical Note TN_113 Simplified Description of USB Device Enumeration", Doc. Ref. No. FT_000180, Version 1.0, Issue Date Oct. 28, 2009, 19 pages.

Lee W. Young, Authorized Officer, U.S. Patent and Trademark Office, "International Search Report" in connection with related PCT Patent App. No. PCT/US2013/027835, dated May 3, 2013, 4 pages.

Lee W. Young, Authorized Officer, U.S. Patent and Trademark Office, "Written Opinion of the International Searching Authority" in connection with related PCT Patent App. No. PCT/US2013/027835, dated May 3, 2013, 8 pages.

Márquez, T. López, Authorized Officer, European Patent Office, "International Search Report" in connection with related PCT Patent App. No. PCT/US2013/029469, dated Jun. 6, 2013, 5 pages.

Márquez, T. López, Authorized Officer, European Patent Office, "Written Opinion of the International Searching Authority" in connection with related PCT Patent App. No. PCT/US2013/029469, dated Jun. 6, 2013, 5 pages.

Jochen Helms, Authorized Officer, European Patent Office, "International Search Report" in connection with related PCT Patent App. No. PCT/US2013/023665, dated Jun. 20, 2013, 5 pages.

Jochen Helms, Authorized Officer, European Patent Office, "Written Opinion of the International Searching Authority" in connection with related PCT Patent App. No. PCT/US2013/023665, dated Jun. 20, 2013, 10 pages.

Eric A. Juntunen, "60 GHz CMOS Pico-Joule/Bit Oook Receiver Design for Multi-Gigabit Per Second Wireless Communications" thesis paper, Aug. 2008, 52 pages.

Murcia Martinez, J., Authorized Officer, European Patent Office, "International Search Report" in connection with related Application Serial No. PCT/US2012/040214, dated Aug. 21, 2012, 3 pages.

Murcia Martinez, J., Authorized Officer, European Patent Office, "Written Opinion of the International Searching Authority" in connection with related Application Serial No. PCT/US2012/040214, dated Aug. 21, 2012, 8 pages.

Ablerga, Vito, Authorized Officer, European Patent Office, "International Search Report" in connection with related Application Serial No. PCT/US2012/042616,, dated Oct. 1, 2012, 4 pages.

Ablerga, Vito, Authorized Officer, European Patent Office, "Written Opinion of the International Searching Authority" in connection with related Application Serial No. PCT/US2012/042616,, dated Oct. 1, 2012, 10 pages.

Cortes Rosa, Joao, Authorized Officer, European Patent Office, "International Search Report" in connection with related Application No. PCT/US2012/030166, dated Oct. 31, 2010, 6 pages.

Cortes Rosa, Joao, Authorized Officer, European Patent Office, "Written Opinion of the International Searching Authority" in connection with related Application No. PCT/US2012/030166, dated Oct. 31, 2010, 9 pages.

Helms, Jochen, Authorized Officer, European Patent Office, "International Search Report" in connection with related Application No. PCT/US2012/055488, dated Dec. 13, 2012, 4 pages.

Helms, Jochen, Authorized Officer, European Patent Office, "Written Opinion of the International Searching Authority" in connection with related Application No. PCT/US2012/055488, dated Dec. 13, 2012, 8 pages.

Helms, Jochen, Authorized Officer, European Patent Office, "International Search Report" in connection with related Application No. PCT/US2012/045444, dated Jan. 21, 2013, 7 pages.

Helms, Jochen, Authorized Officer, European Patent Office, "Written Opinion of the International Searching Authority" in connection with related Application No. PCT/US2012/045444, dated Jan. 21, 2013, 9 pages.

Helms, Jochen, Authorized Officer, European Patent Office, "International Search Report" in connection with related Application No. PCT/US2012/037795, dated Jan. 21, 2013, 7 pages.

Helms, Jochen, Authorized Officer, European Patent Office, "Written Opinion of the International Searching Authority" in connection with related Application No. PCT/US2012/037795, dated Jan. 21, 2013, 12 pages.

Helms, Jochen, Authorized Officer, European Patent Office, "International Search Report" in connection with related Application No. PCT/US2012/061345, dated Jan. 24, 2013, 4 pages.

Helms, Jochen, Authorized Officer, European Patent Office, "Written Opinion of the International Searching Authority" in connection with related Application No. PCT/US2012/061345, dated Jan. 24, 2013, 7 pages.

Franz, Volker, Authorized Officer, European Patent Office, "International Search Report" in connection with related Application No. PCT/US2012/061346, dated Jan. 24, 2013, 5 pages.

Franz, Volker, Authorized Officer, European Patent Office, "Witten Opinion of the International Searching Authority" in connection with related Application No. PCT/US2012/061346, dated Jan. 24, 2013, 9 pages.

Bouhana, Emmanuel, Authorized Officer, European Patent Office, "International Search Report" in connection with related Application No. PCT/US2012/069576, dated May 2, 2013, 3 pages.

Bouhana, Emmanuel, Authorized Officer, European Patent Office, "Written Opinion of the International Searching Authority" in connection with related Application No. PCT/US2012/069576, dated May 2, 2013, 13 pages.

\* cited by examiner

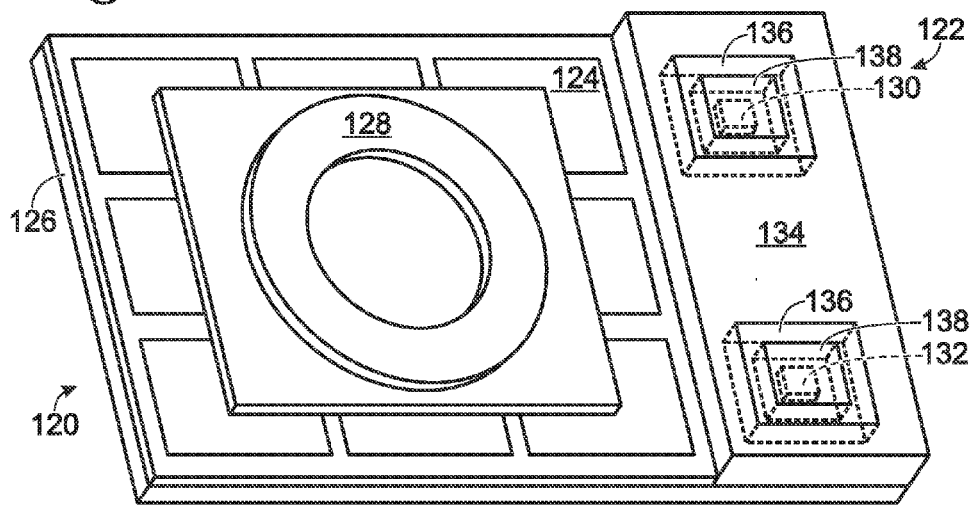
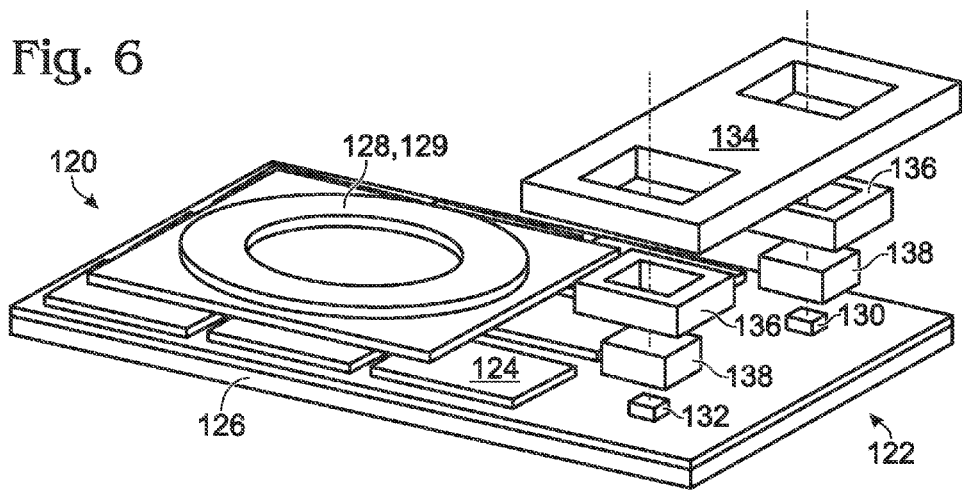
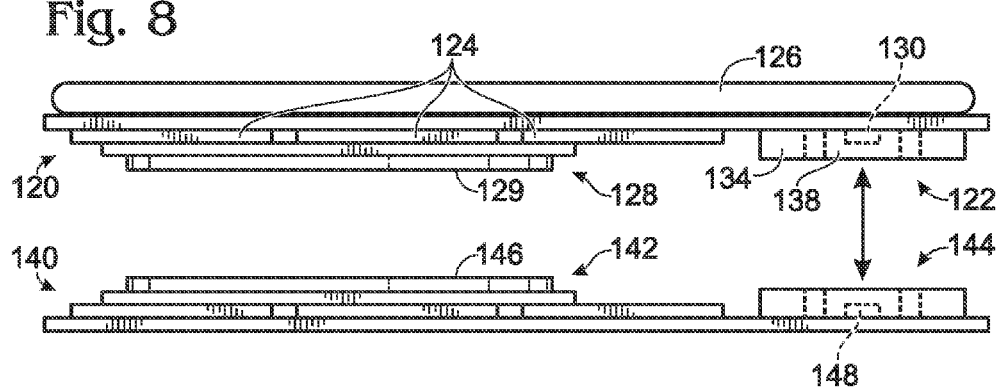

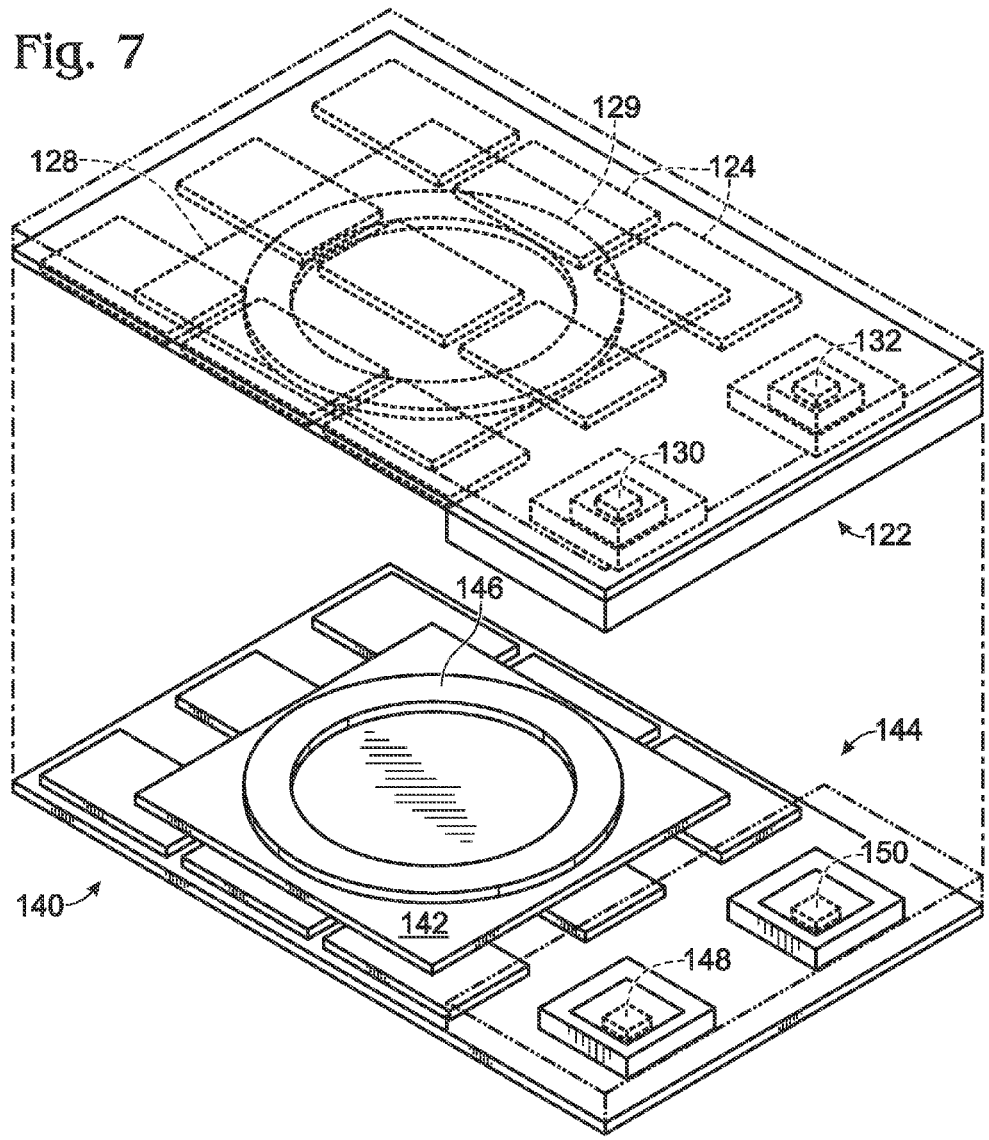
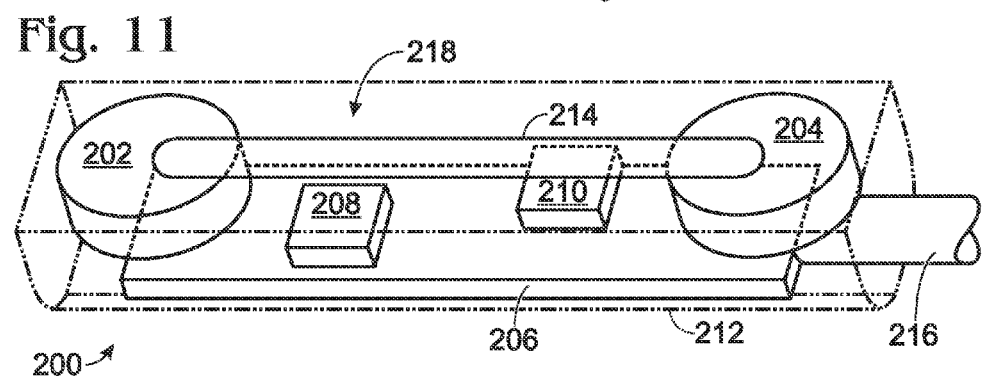

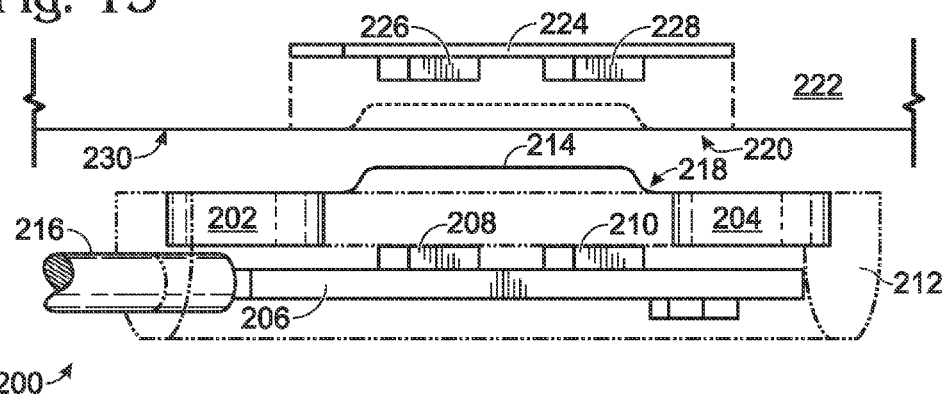
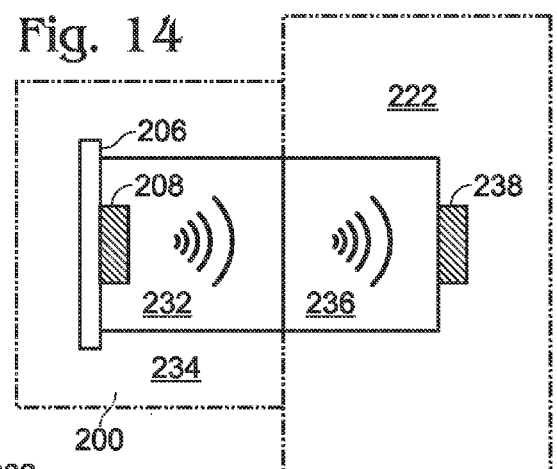
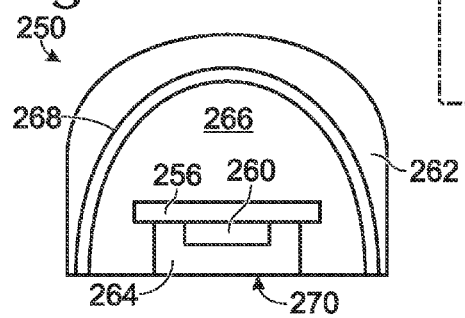
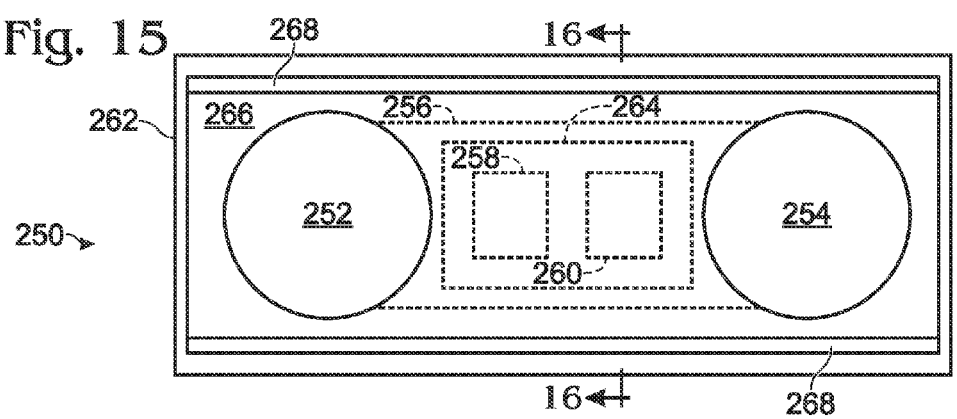

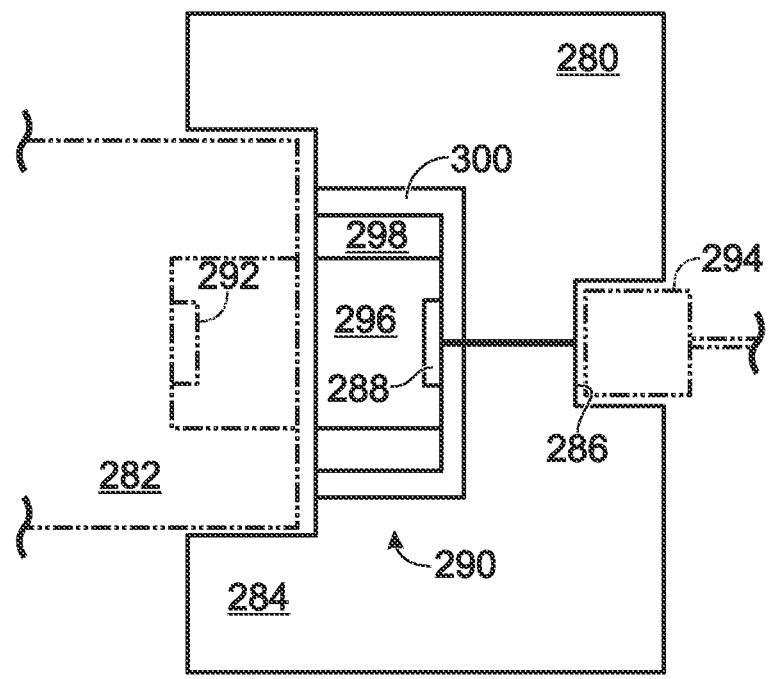

WIRELESS COMMUNICATION WITH DIELECTRIC MEDIUM

CROSS-REFERENCES TO RELATED APPLICATIONS

This application claims the benefit of the following U.S. Provisional Patent Applications: (i) Ser. No. 61/535,277, filed Sep. 15, 2011 and entitled "Wireless Power and Data Transfer System"; (ii) Ser. No. 61/570,709, filed Dec. 14, 2011 and entitled "Dielectric and Shielding Architecture in an EHF Connector"; and (iii) Ser. No. 61/592,491, filed Jan. 30, 2012 and entitled "Link Emission Control System and Method"; which applications are incorporated herein by reference in their entirety for all purposes

TECHNICAL FIELD

This disclosure relates to systems and methods for Extremely High Frequency ("EHF") communications, including communication over a dielectric medium.

BACKGROUND

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic systems with at least two PCBs and the need to communicate information between those PCBs, a variety of connector and backplane architectures have been developed to facilitate information flow between the boards. Connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling.

SUMMARY

In a first example, an electronic device may include a first dielectric substrate, at least a first electronic circuit supported by the substrate, for processing data, and at least a first communication unit having a first antenna. The first communication unit may be mounted to the substrate in communication with the at least a first electronic circuit for converting between a first EHF electromagnetic signal containing digital information and a first data signal conducted by the at least a first electronic circuit. The first electromagnetic signal may be transmitted or received along a first signal path by the first antenna. A first electromagnetic (EM) signal guide assembly may include a first dielectric element made of a first dielectric material disposed proximate the first antenna in the first signal path. The first EM signal guide may have sides extending along the first signal path. A first sleeve element may extend around the first dielectric element along at least a portion of the sides of the first dielectric element. The first sleeve element may impede transmission of the first EM signal through the sides of the first dielectric element.

In a second example, a first electronic connector element may include a first EHF comm-link chip, a first dielectric material encasing the first comm-link chip and extending from the first chip toward a first interface surface spaced from the first comm-link chip. The first comm-link chip may be configured to transmit or receive an electromagnetic signal having a first signal path extending through the dielectric material and the first interface surface. An electrically conductive shielding material may be supported by the dielectric material and may extend from a first side of the first interface surface around the first comm-link chip opposite the first interface surface to a second side of the first interface surface spaced from the first side of the first interface surface.

In a third example, a system may include a first device and a second device. The first device may include a first electrical circuit and a first electronic connector component having a first dielectric material. A first EHF comm-link chip may be embedded in the first dielectric material and connected to the first electrical circuit for communicating a first electromagnetic signal that propagates along a first signal path passing through the first dielectric material. An electrically conductive shielding layer may extend around at least a portion of the first signal path in the first dielectric material. The second device may include a second electrical circuit and a second electronic connector component having a second dielectric material and a second EHF comm-link chip embedded in the second dielectric material and connected to the second electrical circuit for communicating a second electromagnetic signal that propagates along a second signal path passing through the second dielectric material. The first and second EHF comm-link chips may be configured to communicate with each other when the first and second electronic connector components are positioned with the first dielectric material in contact with the second dielectric material with the first signal path aligned with the second signal path. Communication along the first and second signal paths may occur substantially entirely through the first dielectric material and the second dielectric material.

A fourth example may include an adapter for interconnecting a first electronic device having a first electrically conductive connector element with a second electronic device having an EHF electromagnetic signal connector element. The adapter may include a dielectric material, an EHF comm-link chip embedded in the dielectric material and configured to communicate the electromagnetic signal with the electromagnetic signal connector element, and a second electrically conductive connector element electrically connected to the comm-link chip and configured to electrically connect to the first electrically conductive connector element.

In a fifth example, a system may include a first device and a second device. The first device may include a first EHF comm-link chip assembly configured to transmit a first EHF electromagnetic signal, a first shield partly surrounding the first EHF comm-link chip assembly, and a first circuit in communication with the first EHF comm-link chip assembly. The second device may have a second EHF comm-link chip assembly configured to receive the first EHF electromagnetic signal and a second shield partly surrounding the second EHF comm-link chip assembly. The first and second shields may be configured mutually to create a substantially continuous shield around the first and second EHF comm-link chip assemblies when the first and second devices are aligned.

Advantages of such systems and methods will be more readily understood after considering the drawings and the Detailed Description.

BRIEF DESCRIPTION OF THE DRAWINGS

FIG. 5 shows a perspective view of an exemplary portable device including an inductive power receiver and IC packages with dielectric guiding structures.

FIG. 6 shows a partially exploded view of the portable device of FIG. 5.

FIG. 7 shows the portable device of FIG. 5 facing an exemplary base unit including an inductive power source and IC packages.

FIG. 8 shows a side view of the portable device and base unit of FIG. 7 in mutual alignment.

FIG. 11 shows a perspective view of an exemplary connector.

FIG. 13 shows an exemplary connector proximate an exemplary external device.

FIG. 14 shows a sectional view of an exemplary connector adjacent an exemplary external device.

FIG. 15 shows a plan view of a mating surface of an exemplary connector.

FIG. 16 shows a cross-section taken along line 16-16 in FIG. 15.

FIG. 17 shows a diagram of an exemplary adapter system.

DETAILED DESCRIPTION

Figure 1:
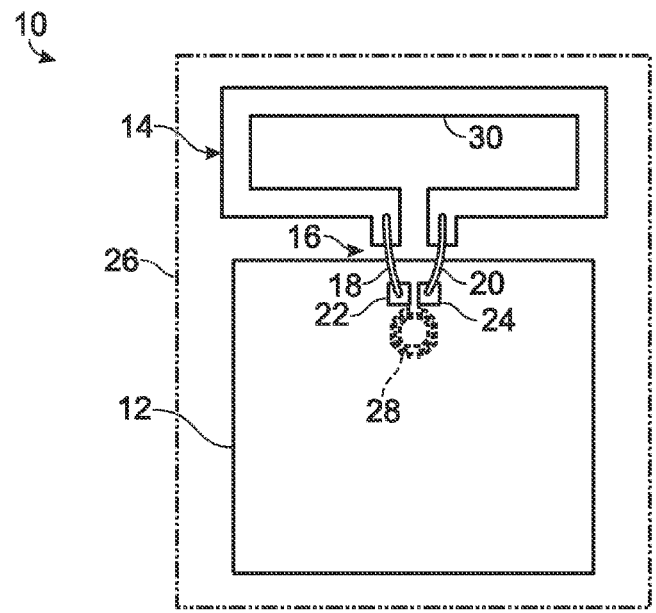
FIG. 1 shows a simplified schematic overhead view of a first example of an integrated circuit (IC) package including a die and antenna.

Wireless communication may be used to provide signal communications between components on a device or may provide communication between devices. Wireless communication provides an interface that is not subject to mechanical and electrical degradation. Examples of systems employing wireless communication between chips are disclosed in U.S. Pat. No. 5,621,913 and U.S. Published Patent Application No. 2010/0159829, the disclosures of which are incorporated herein by reference in their entirety for all purposes.

In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may not be contiguous with respect to each other. In some examples, the transmitter and receiver may be disposed on separate circuit carriers positioned with the antennas of the transmitter/receiver pair in close proximity.

As discussed below, a transmitter and/or receiver may be configured as an IC package, in which one or more antennas may be positioned adjacent to a die and held in place by a dielectric or insulating encapsulation or bond material. An antenna may also be held in place by a lead frame substrate. Examples of EHF antennas embedded in IC packages are shown in the drawings and described below. Note that IC packages may also be referred to as simply packages, and are examples of wireless communication units that are also variously referred to as EHF communication units, communication units, communication devices, comm-link chips, comm-link chip assemblies, comm-link chip packages, and/or comm-link packages, which may be configured in various ways. For example, IC packages, communication units, communication devices, comm-link chips, comm-link chip assemblies, comm-link chip packages, and/or comm-link packages may each include one or more ICs, chips, or dies and have circuit functionality appropriate for particular applications.

FIG. 1 shows an exemplary IC package, generally indicated at 10. IC package 10 includes a chip or die 12, a transducer 14 providing conversion between electrical and electromagnetic (EM) signals, and conductive connectors 16, such as bond wires 18, 20 electrically connecting the transducer to bond pads 22, 24 connected to a transmitter or receiver circuit included in die 12. IC package 10 further includes an encapsulating material 26 formed around at least a portion of the die and/or the transducer. In this example encapsulating material 26 covers die 12, conductive connectors 16, and transducer 14, and is shown in phantom lines so that details of the die and transducer may be illustrated in solid lines.

Die 12 includes any suitable structure configured as a miniaturized circuit on a suitable die substrate, and is functionally equivalent to a component also referred to as a chip or an integrated circuit (IC). A die substrate may be any suitable semiconductor material; for example, a die substrate may be silicon. Die 12 may have a length and a width dimension, each of which may be about 1.0 mm to about 2.0 mm, and preferably about 1.2 mm to about 1.5 mm. Die 12 may be mounted with further electrical conductors 16, such as a lead frame, not shown in FIG. 1, providing connection to external circuits. A transformer 28, shown in dashed lines, may provide impedance matching between a circuit on die 12 and transducer 14.

Transducer 14 may be in the form of a folded dipole or loop antenna 30, may be configured to operate at radio frequencies such as in the EHF spectrum, and may be configured to transmit and/or receive electromagnetic signals. Antenna 30 is separate from but operatively connected to die 12 by suitable conductors 16, and is located adjacent to die 12.

The dimensions of antenna 30 are suitable for operation in the EHF band of the electromagnetic frequency spectrum. In one example, a loop configuration of antenna 30 includes a 0.1 mm band of material, laid out in a loop 1.4 mm long and 0.53 mm wide, with a gap of 0.1 mm at the mouth of the loop, and with the edge of the loop approximately 0.2 mm from the edge of die 12.

Encapsulating material 26 is used to assist in holding the various components of IC package 10 in fixed relative positions. Encapsulating material 26 may be any suitable material configured to provide electrical insulation and physical protection for the electrical and electronic components of IC package 10. For example, encapsulating material 26, also referred to as insulating material, may be a mold compound, glass, plastic, or ceramic. Encapsulating material 26 may also be formed in any suitable shape. For example, encapsulating material 26 may be in the form of a rectangular block, encapsulating all components of IC package 10 except the unconnected ends of conductors 16 connecting the die to external circuits. External connections may be formed with other circuits or components.

Figure 2:
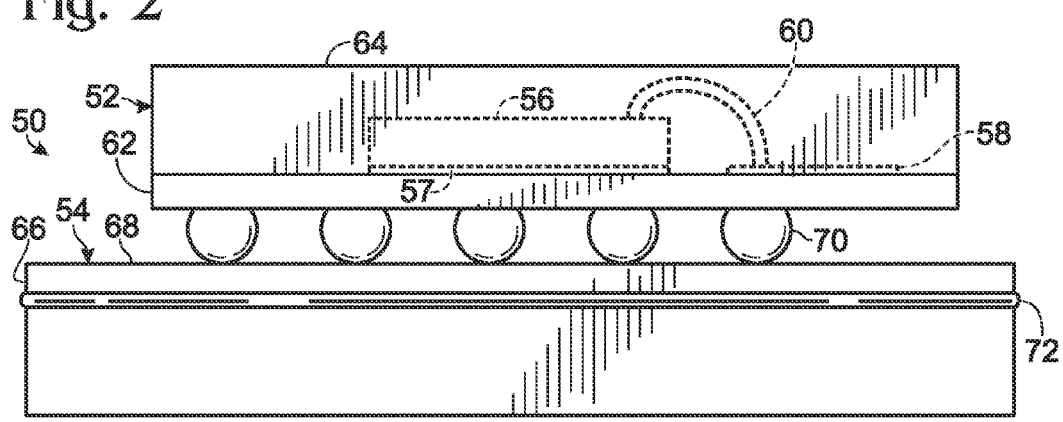
FIG. 2 shows a schematic side view of an exemplary communication device including an IC package and printed circuit board (PCB).

FIG. 2 shows a representational side view of a communication device 50 including an IC package 52 flip-mounted to an exemplary printed circuit board (PCB) 54. In this example, it may be seen that IC package 52 includes a die 56, a ground plane 57, an antenna 58, bond wires, including bond wire 60, connecting the die to the antenna. The die, antenna, and bond wires are mounted on a package substrate 62 and encapsulated in encapsulating material 64. Ground plane 57 may be mounted to a lower surface of die 56, and may be any suitable structure configured to provide an electrical ground for the die. PCB 54 may include a top dielectric layer 66 having a major face or surface 68. IC package 52 is flip-mounted to surface 68 with flip-mounting bumps 70 attached to a metallization pattern (not shown).

PCB 54 may further include a layer 72 spaced from surface 68 made of conductive material forming a ground plane within PCB 54. The PCB ground plane may be any suitable structure configured to provide an electrical ground to circuits and components on PCB 54.

Figure 3:
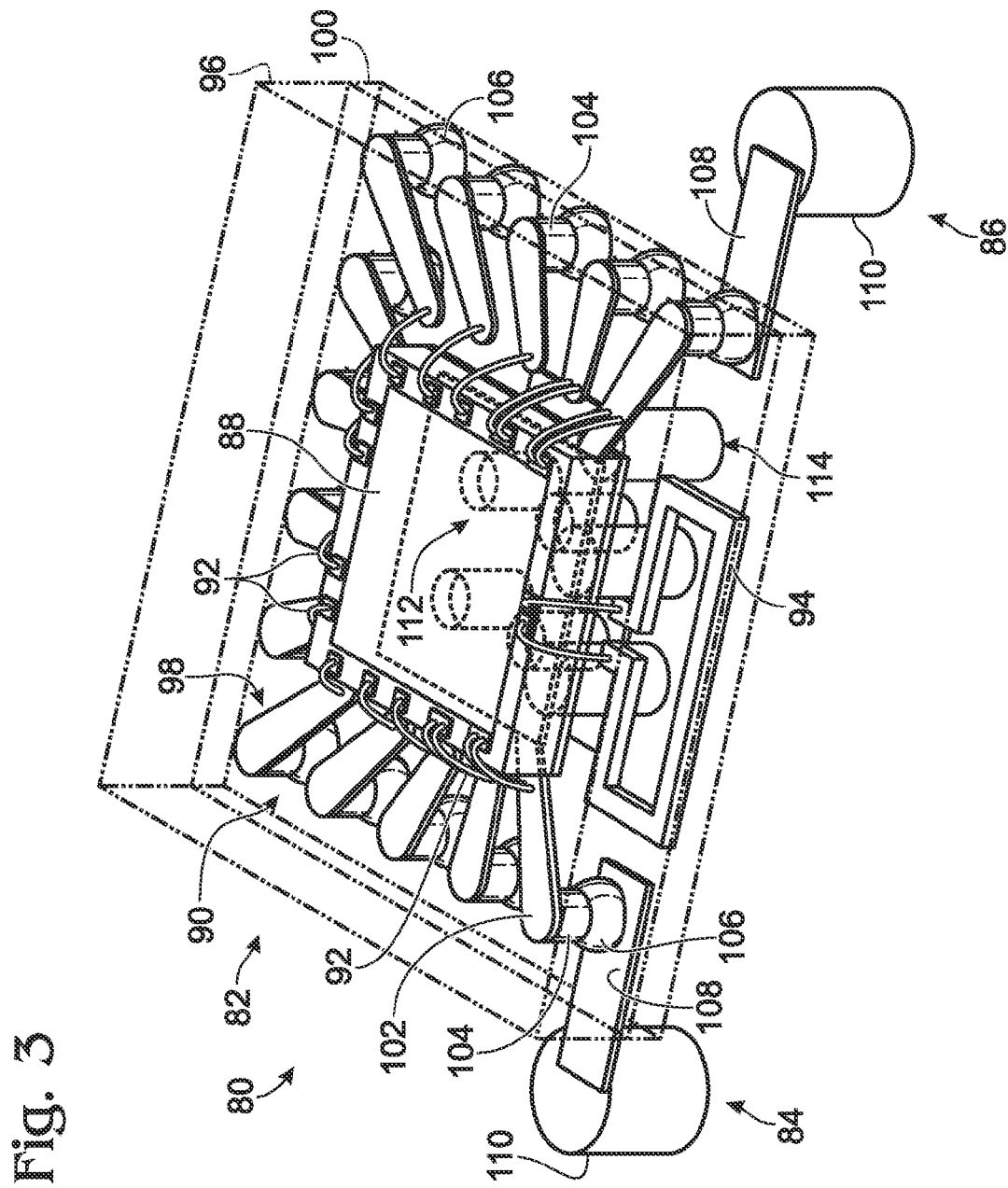
FIG. 3 shows an isometric view of another exemplary communication device including an IC package with external circuit conductors.
Figure 4:
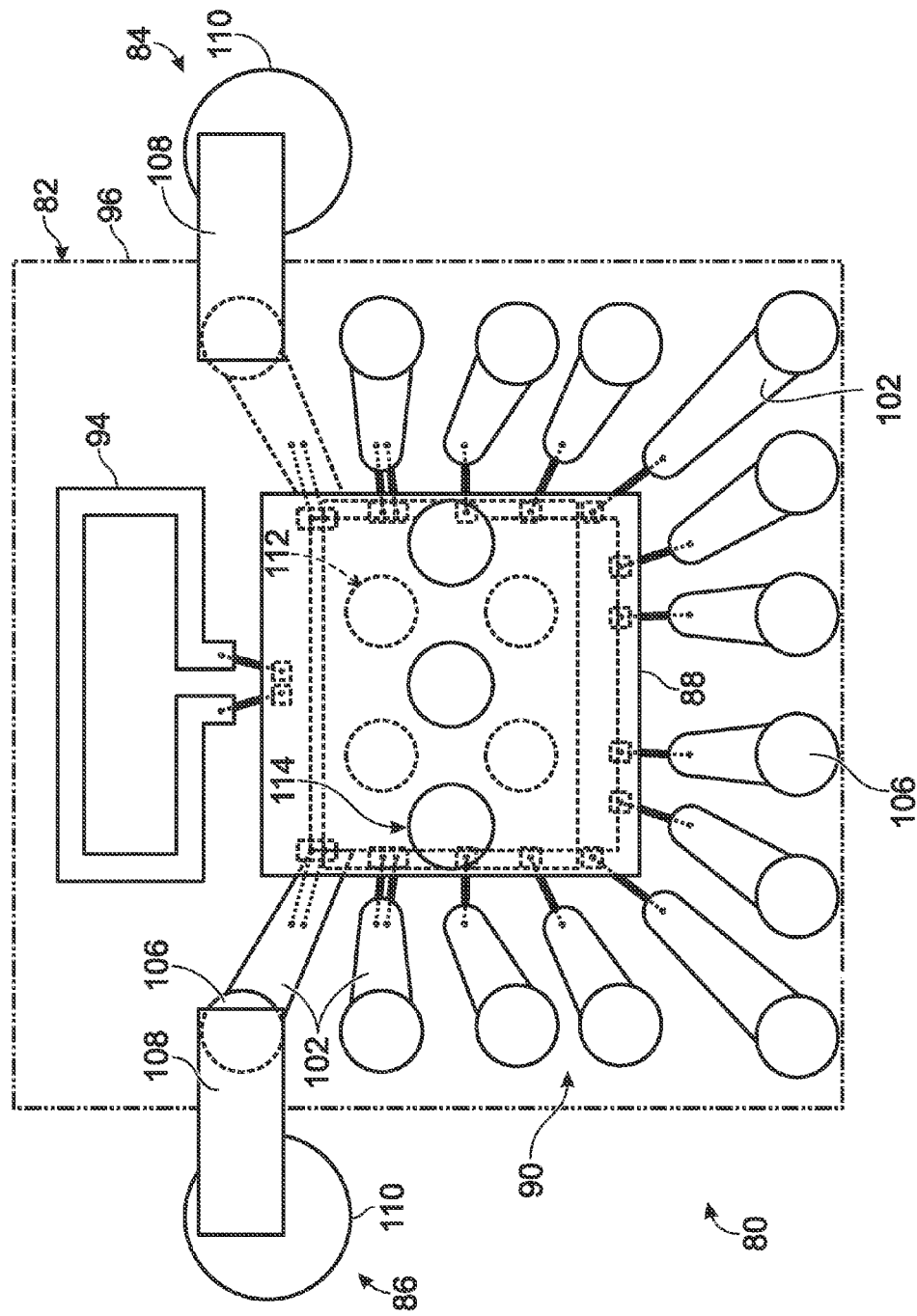
FIG. 4 shows a bottom view of the exemplary communication device of FIG. 3.

FIGS. 3 and 4 illustrate another exemplary communication device 80 including an IC package 82 with external circuit conductors 84 and 86. In this example, IC package 82 may include a die 88, a lead frame 90, conductive connectors 92 in the form of bond wires, an antenna 94, encapsulating material 96, and other components not shown to simplify the illustration. Die 88 may be mounted in electrical communication with lead frame 90, which may be any suitable arrangement of electrical conductors or leads 98 configured to allow one or more other circuits to operatively connect with die 90. Antenna 94 may be constructed as a part of the manufacturing process that produces lead frame 90.

Leads 98 may be embedded or fixed in a lead frame substrate 100, shown in phantom lines, corresponding to package substrate 62. The lead frame substrate may be any suitable insulating material configured to substantially hold leads 98 in a predetermined arrangement. Electrical communication between die 88 and leads 98 of lead frame 90 may be accomplished by any suitable method using conductive connectors 92. As mentioned, conductive connectors 92 may include bond wires that electrically connect terminals on a circuit of die 88 with corresponding lead conductors 98. For example, a conductor or lead 98 may include a plated lead 102 formed on an upper surface of lead frame substrate 100, a via 104 extending through the substrate, a flip-mounting bump 106 mounting IC package 82 to a circuit on a base substrate, such as a PCB, not shown. The circuit on the base substrate may include external conductors, such as external conductor 84, which for example, may include a strip conductor 108 connecting bump 106 to a further via 110 extending through the base substrate. Other vias 112 may extend through the lead frame substrate 100 and there may be additional vias 114 extending through the base substrate.

In another example, die 88 may be inverted and conductive connectors 92 may include bumps, or die solder balls, as described previously, which may be configured to electrically connect points on a circuit of die 88 directly to corresponding leads 98 in what is commonly known as a "flip chip" arrangement.

A first and a second IC package 10 may be co-located on a single PCB and may provide intra-PCB communication. In other examples, a first IC package 10 may be located on a first PCB and a second IC package 10 may be located on a second PCB and may therefore provide inter-PCB communication.

Turning to FIGS. 5 and 6, an exemplary portable device will now be described. A portable device 120 may be any device configured to be powered wirelessly using an inductive power system and also to communicate wirelessly using one or more IC packages 10. Portable device 120 may include an EHF communication circuit 122, a data storage unit 124, local power storage device 126, and/or inductive power receiver 128. The components of portable device 120 may be contained in a case (not shown). FIGS. 5 and 6 depict an example of a portable device 120 showing possible locations of various components. FIG. 6 is a partially exploded version of the device shown in FIG. 5. A portable device may also be a portable media device (pmd), which may take the form of a cell phone, personal digital assistant (pda), MP3 players, notebook computer, or tablet.

EHF communication circuit 122 may be any circuit configured to communicate wirelessly using one or more IC packages 10. For example, EHF communication circuit 122 may include two IC packages 130 and 132, one configured as a transmitter and the other configured as a receiver as depicted in FIGS. 5 and 6. IC packages 130 and 132 may be configured to communicate with other IC packages in other devices rather than with other such chips in the same device. In some examples, only one IC package may be included, with the IC package configured as a transceiver.

EHF communication circuit 122 may be in electrical communication with digital data storage unit 124. Data storage unit 124 may be any suitable data storage unit capable of reading and writing data. For example, data storage unit 124 may be an IC chip, card, disk, or SSD. In typical operation, EHF communication circuit 122 may transfer data between data storage unit 124 and an external device.

EHF communication circuit 122 may also receive power from local power storage device 126. Power storage device 126 may be any suitable device configured to store electrical energy for future use. For example, power storage device 126 may be a lithium ion battery, a fuel cell, an ultracapacitor, or any other battery-like device that may be charged and discharged. Typically, the voltage supplied by such a device may need to be stepped down using suitable circuitry in EHF communication circuit 122 to make the voltage usable by the circuit and IC packages. IC packages such as IC package 130 and 132 typically operate in the approximate range of 1.2 to 3.3 V.

Inductive power receiver 128 may be in electrical communication with local power storage device 126 and may function to charge power storage device 126. Inductive power receiver 128 may be any suitable device capable of receiving wireless energy transfer from a power source. For example, inductive power receiver 128 may include a secondary coil 129 in which a current may be induced by a primary coil located in a separate charging device. Worldwide open standards for this sort of inductive charging have been developed. For example the "Qi" standard developed by the Wireless Power Consortium has begun to be utilized in commercial products.

The illustrative portable device 120 in FIGS. 5 and 6 may further include conductive suppressor 134, dielectric isolation barrier 136, and dielectric directing portion 138. Conductive suppressor 134 may be any suitable structure configured to suppress ingress or egress of spurious EHF radiation. For example suppressor 134 may be constructed as an expanse of conductive material disposed laterally around dielectric isolation barrier 136. Dielectric isolation barrier 136 may be any suitable structure or gap configured to isolate dielectric directing portion 138 from suppressor 134. For example, dielectric isolation barrier 136 may be a low-$E_r$ dielectric such as foam, or may be an air gap laterally surrounding dielectric directing portion 138. Dielectric directing portion 138 may be any suitable dielectric structure configured to enhance and/or direct EHF radiation. For example, dielectric directing portion 138 may be a block of high-$E_r$ material such as plastic.

A portable device such as portable device 120 may function independently (e.g., as a portable media device), and may interact and/or receive power from other devices. For example, a base unit may be one such device. As shown in FIGS. 7-8, a base unit 140 may be any suitable device configured to wirelessly communicate with portable device 120 and to wirelessly provide power to portable device 120. For example, base unit 140 may include a housing (not shown) that encloses an inductive power source 142 and/or an EHF communications circuit 144.

In some examples, base unit 140 may include or be in communication with a host controller (not shown), which may be any suitable device or component configured to control the electronic activity of an overall system including portable device 120 and base unit 140. For example, a host controller may be a personal computing device configured via software and/or firmware to coordinate synchronization of data between portable device 120 and a personal computer. In other examples, a host controller may include any or all of the following: a video player; audio player; security system; display system; music, video, and/or audiobook organizer; data back-up storage system; portable phone manager; etc.

Note that in some examples, at least some roles of the two devices may be reversed. Accordingly, a host controller may be located in portable device 120 and base unit 140 may include a storage unit such as storage unit 124. In other examples, both devices may include host controller and/or storage unit 124, enabling functionality such as device-to-device data copying. In other examples, portable device 120 may control a transaction wherein a video playing or available on portable device 120 may appear on a base unit 140 that includes a video display. This transaction may be controlled entirely from the portable device.

Inductive power source 142 may be any suitable device configured to provide electrical power wirelessly to inductive power receiver 128. As described above, inductive power source 142 may include primary coil 146.

EHF communications circuit 144 may include one or more IC packages 10, such as IC packages 148 and 150, configured to transfer information to and from the IC package(s) in portable device 120. For each transmitter IC package in portable device 120, a corresponding receiver IC package may be provided in base unit 140. In similar fashion, a receiver in portable device 120 may have a corresponding transmitter in base unit 140. In some examples, IC packages may be configured as transceivers, and each two-way link may be established using one IC package per device. To facilitate data transfer, the resulting transmitter-receiver or transceiver-transceiver pairs may be disposed such that proper general alignment of the devices also aligns all pairs of IC packages.

Alternatively, some transmitter-receiver or transceiver-transceiver pairs may be aligned when the devices are placed in a first configuration while others may be aligned when the devices are placed in a second configuration. For example, a base unit 140 may provide two sets of markings on an interface surface. One set of markings may indicate where to place portable device 120 to enable data synchronization, while the other may indicate where to place portable device 120 to enable music playback or some other functionality, and both positions may allow simultaneous battery charging.

FIGS. 7 and 8 show portable device 120 and a base unit 140. As depicted in FIG. 7, inductive power source 142 and IC packages 148 and 150 may be disposed and configured in a spatial arrangement complementary to the corresponding components in portable device 120. FIG. 8 further illustrates this complementary arrangement, depicting a portable device 120 in docking alignment with base unit 140. As noted above, each device may include a single IC package configured as a transceiver rather than two IC packages respectively configured as a transmitter and receiver.

Regarding EHF signals that may be transmitted and received between devices such as portable device 120 and base unit 140, governmental emissions limits may exist for a given licensed emissions band. It is noted that an unmodulated signal may provide a narrower band of emissions, thereby avoiding violation of an emissions limit in some applications. On the other hand, a modulated signal may produce a broader band of emissions that in some applications may extend outside the licensed band.

Figure 9:
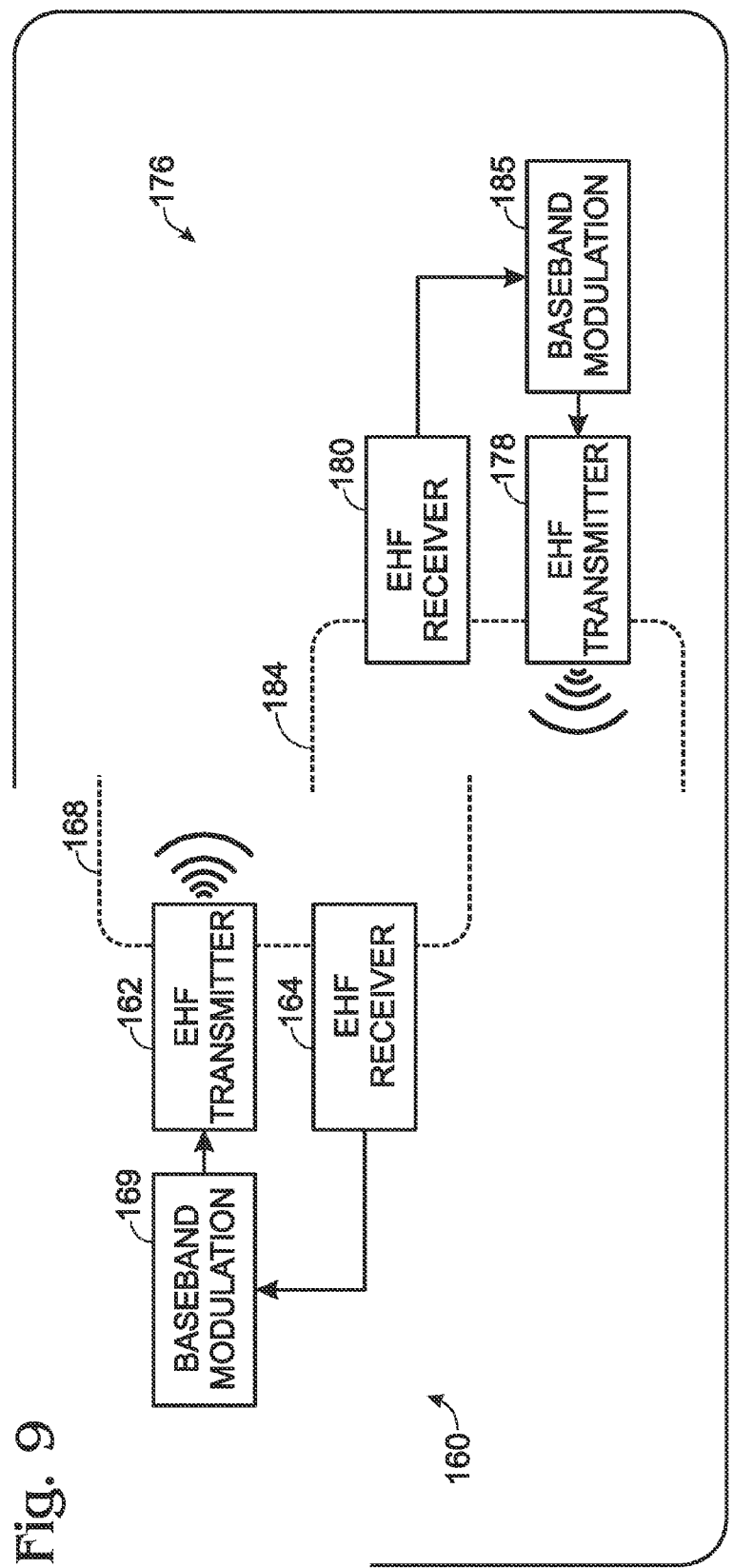
FIG. 9 shows a block diagram of unaligned exemplary first and second electronic devices each having partial shielding.
Figure 10:
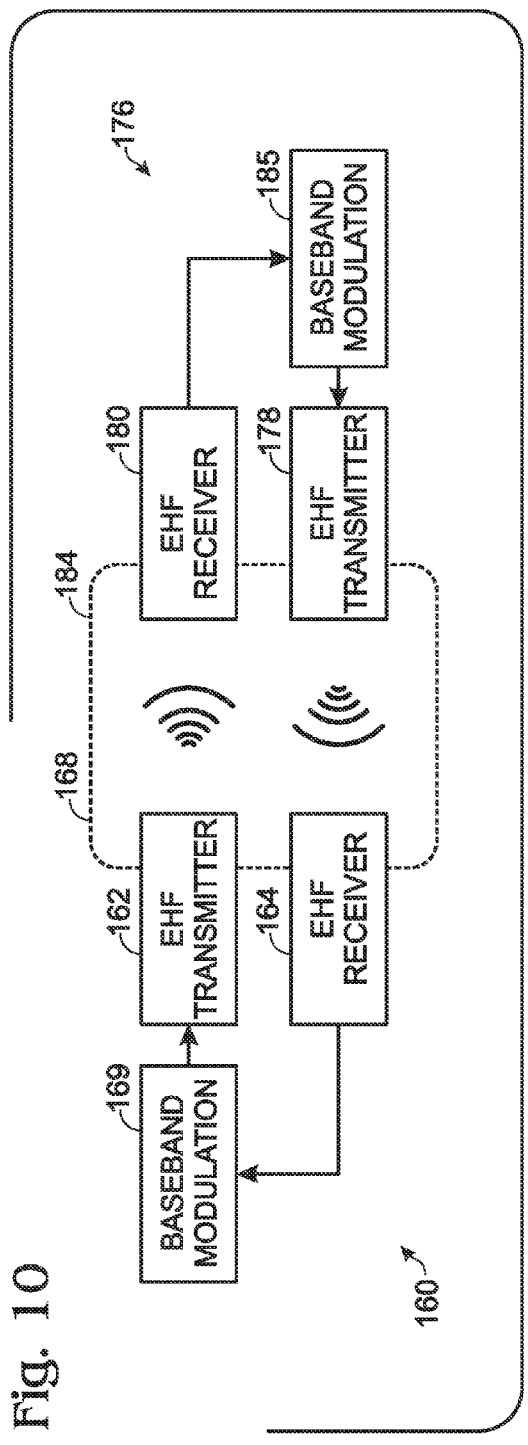
FIG. 10 shows a block diagram of aligned exemplary first and second electronic devices each having partial shielding.

FIGS. 9 and 10 are block diagrams showing two exemplary devices configured to limit the production of emissions which may extend outside of a given band. A portion of a first electronic device 160 may include two examples of IC packages 10, specifically a transmitter 162 and a receiver 164, electrically connected to a baseband modulation circuit 169. A discontinuous shield 168 may partly surround IC packages 162 and 164. For example, a portion of first electronic device 160 may include a layer or section of material that acts to inhibit or block EHF signals. Shield 168 may include any suitable material configured to inhibit or block electromagnetic signals having an EHF frequency. For example, a grounded electromagnetically conductive material may drain an EHF signal to ground, and a dissipative material may absorb an EHF signal and convert it to heat within the material. This shielding layer or section may be discontinuous in the sense that it does not form a continuous shield in every direction, but rather includes an opening or openings in one or more directions. The partial shielding configuration is represented in FIGS. 9 and 10 as a U-shaped cross section. As further described below, shield 168 may be configured to facilitate a mating relationship with a corresponding shield on another device.

Transmitter chip 162 may be an example of the previously described IC package 10, and may be adapted to transmit an EHF signal provided by one or more circuits in device 160 in upstream series with baseband modulation circuit 169. For example, transmitter chip 162 may transmit a substantially constant signal, a modulated signal, an intermittent signal, a combination of these, or any other signal capable of being transmitted in the EHF band. Receiver chip 164 may also be an example of the previously described IC package 10, and may be adapted to receive an EHF signal and to provide that signal in electronic form to one or more circuits in first device 160, including baseband modulation circuit 169. Note that transmitter and receiver packages 162 and 164 may be replaced in some examples by a single transceiver package configured to both transmit and receive.

Baseband modulation circuit 169 may be any suitable circuit configured to select between two or more signals based on one or more inputs. In the embodiment shown in FIGS. 9 and 10, baseband modulation circuit 169 may include a multiplexer circuit adapted to receive inputs from transmitter chip 162, receiver chip 164, a modulated signal generator, and one or more signal generating circuits, such as an unmodulated signal generator.

With continuing reference to FIGS. 9 and 10, a second electronic device 176 may be similar to first device 160, and may include a transmitter chip 178, a receiver chip 180, a baseband modulation circuit 185, and a shield 184 with similar functions and connections as the corresponding components of first device 160.

As depicted in FIGS. 9 and 10, devices 160 and 176 may be physically moved from a misaligned to an aligned relationship. In this context, alignment refers to axial and proximal alignment of the transmitter-receiver pairs, namely transmitter 162 and receiver 180 as well as transmitter 178 and receiver 164. In other examples, these may be replaced by a suitable transceiver-transceiver pair. Proper alignment of these pairs may allow EHF signal communication between at least one of the pairs and thus communication between the first and second devices. The shields of devices 160 and 176 may also be configured to ensure that the shields are aligned when the transmitter-receiver or transceiver-transceiver pairs are in proper alignment. As mentioned previously, discontinuous shield 168 and discontinuous shield 184 may be configured as mates, capable of forming a single continuous shield around the pairs of IC packages when the shields are placed in an aligned and mated position.

Figure 12:
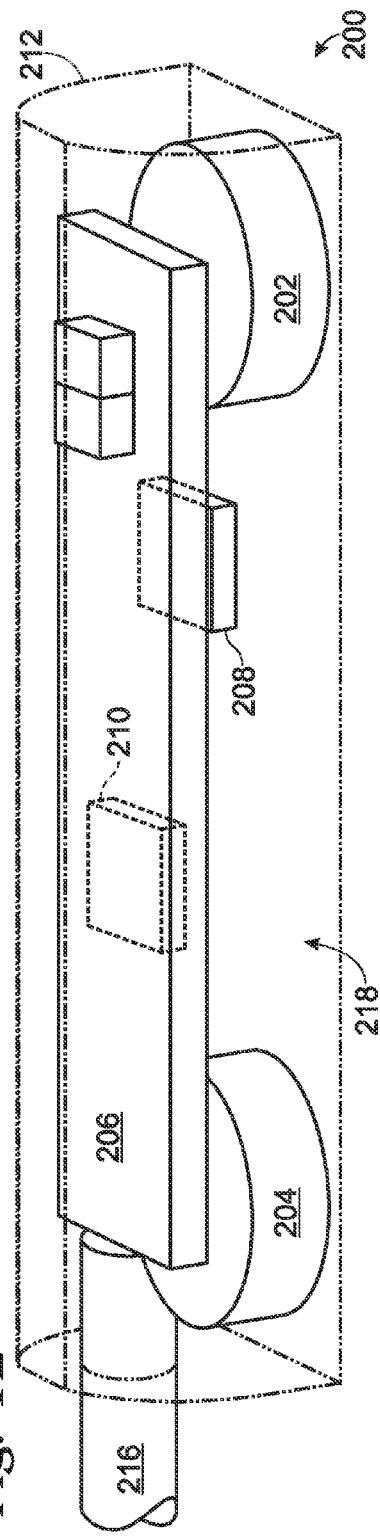
FIG. 12 shows another perspective view of the exemplary connector of FIG. 11.

Turning now to FIGS. 11 and 12, an exemplary connector 200 incorporating one or more IC packages 10 is depicted. Connector 200 may be any suitable connector component configured to provide a zero- or low-insertion EHF connection interface for a corresponding connector component on another device or system. Connector 200 may include two magnets, 202 and 204, a connector PCB 206, two IC packages 10, labeled as 208 and 210, a connector body 212, and/or a connector alignment portion 214. Furthermore, connector 200 may be electrically and physically connected to a cable 216.

Connector body 212 may serve as a housing or container for other components of connector 200. In some examples, connector body 212 may encapsulate PCB 206 and IC packages 208 and 210 using a suitable dielectric material or materials. Connector body 212 may also be sized and configured to allow convenient manipulation by a user. Magnets 202 and 204 may be at least partially housed in connector body 212, and may be mounted such that both magnets are substantially flush with a mating surface 218 of connector body 212.

Mating surface 218 may be configured to provide a suitable physical coupling surface with a corresponding connector on a corresponding device. In some examples, mating surface 218 is planar. In other examples, mating surface 218 is curved. In still other examples, mating surface 218 includes alignment portion 214. Alignment portion 214 may be a protrusion, ridge, knob, bevel, pin, recess, or other member configured to mate with a corresponding portion on a corresponding target connection region 220 of an external device 222, as shown in FIG. 13, to provide physical alignment feedback to a user.

Magnets 202 and 204 may be any suitable magnetic components configured to releasably hold connector 200 in aligned proximity to target connection region 220 of external device 222. In this context, alignment and proximity may refer to the alignment and proximity of corresponding IC packages, which may need to be substantially aligned and in close enough proximity to enable communication between a given pair of packages. In some examples, magnets 202 and 204 are permanent magnets. In other examples, magnets 202 and 204 are electromagnets. In still other examples, magnets 202 and 204 are constructed of ferrous material capable of being magnetically attracted to magnets on or near target connection region 220.

IC packages 208 and 210 may be mounted on connector PCB 206. In some examples, more or fewer packages, assemblies, or chips may be provided. IC packages 208 and 210 may be mounted on PCB 206 such that an antenna of IC package 208 is oriented orthogonally to an antenna of IC package 210, to take advantage of polarization effects. In other words, orthogonal orientation may allow the packages to be mounted closely together, because orthogonal EHF signals will not substantially interfere with each other.

Connector PCB 206 and related circuits may be electrically connected to cable 216 to allow connector 200 to obtain power and/or informational signals from a source outside of connector 200. For example, cable 216 may provide connector 200 with electrical power as well as providing a data signal path to and/or from a personal computer or other host device.

FIG. 13 shows a connector 200 in close proximity to an illustrative external device 222. As depicted in FIG. 13, external device 222 may include an external device PCB 224 with two IC packages 226 and 228 disposed near an edge 230 of the external device. In some examples, more or fewer IC packages, each with one or more chips, may be provided. Target connection region 220 at edge 230 may include portions made of ferrous material or any other material that provides a magnetically attractive surface to which magnets 202 and 204 may attach. For example, placing connector 200 near target connection region 220 of external device 222 may cause magnets 202 and 204 to be attracted to target connection region 220, pulling connector 200 into proper position and alignment to allow IC packages 208 and 210 to align and communicate with IC packages 226 and 228.

As depicted in FIG. 14, connector body 212 may include a first dielectric material 232 at least partially surrounding IC package 208 and/or 210 (shown in FIG. 14 as IC package 208 for convenience) and a second dielectric material 234 at least partially surrounding first dielectric material 232. First dielectric material 232 may have a relatively high dielectric constant compared to second dielectric material 234. For example, dielectric material 232 may include plastic with a dielectric constant of approximately 2 to approximately 5, while dielectric material 234 may include a substance with a relatively much lower constant. In some examples, dielectric material 234 may include foam or an air gap.

First dielectric material 232 may be configured as a volume of material spanning the region from IC package 208 to mating surface 218 of connector 200. This architecture, with a higher dielectric constant material surrounded by a lower dielectric constant material, may facilitate focusing and shaping of a transmitted EHF signal through dielectric material 232. In some examples, a corresponding high-dielectric material 236 may be included spanning from target connection region 220 at a surface of external device 222 to one or more IC packages 238 within in the external device. In this example, aligning connector 200 in close proximity with target connection region 220 creates a path of substantially continuous dielectric material through which an EHF signal can propagate from package 208 to package 238.

FIGS. 15 and 16 depict two views of a connector 250, which may be an example of a connector 200 incorporating partial shielding similar to that described with respect to FIGS. 9 and 10. FIG. 16 is a cross-section taken along line 16-16 of FIG. 15. Similar to connector 200, connector 250 may include two magnets 252 and 254, a PCB 256, two IC packages 258 and 260, and a body 262, with a first dielectric material 264 proximate the IC packages and a second dielectric material 266 having a lower dielectric constant surrounding first dielectric material 264.

In this example, shielding material 268 may be provided in at least a portion of a connector body 262. Shielding material 268 may include any dissipative or electrically conductive material or layer configured to absorb or otherwise block spurious incoming and outgoing EHF radiation. For example, shielding material 268 may include a copper sheet or layer wrapping around the IC packages and leaving at least a portion of a mating surface 270 unshielded. In addition to acting as an absorptive and/or dissipative shield with respect to EHF radiation, shielding material 268 may provide an electrical circuit ground for one or more circuits in connector 250.

FIG. 17 is a simplified diagram depicting a side cut-out view of an exemplary adapter 280 incorporating some of the components described above. Adapter 280 may be any suitable system configured to adapt an IC package-enabled external device 282 to be used with a standard mechanical or physical plug-type connector. Adapter 280 may include adapter sleeve 284, a female connector element 286, an IC package 288, and a dielectric and shielding architecture 290.

Adapter sleeve 284 may be a housing for the adapter and may also fit closely around at least a portion of external device 282, aligning an IC package 292 of the external device with IC package 288. For example, adapter sleeve 284 may be configured as a partial case for the device. IC package 288 may align and communicate with IC package 292 in the external device when sleeve 284 is attached to device 282. IC package 288 may also be in electrical communication with female connector element 286. Female connector element 286 may present a standard plug-in connector interface to a corresponding male connector element 294 of a physical plug-type connector.

IC package 288 may be embedded in or surrounded by a dielectric and shielding architecture 290 similar to architectures described above. Architecture 290 may include a high-dielectric constant material 296 surrounding IC package 288, material 296 being at least partially surrounded by a low-dielectric constant material 298 as well as a shielding material or layer 300, as depicted in FIG. 17. Communication of an EHF signal between IC packages 288 and 292 may be facilitated by architecture 290. A signal may also be communicated between IC package 288 and male connector element 294 through female connector element 286, as described above. Accordingly, adapter 280 may adapt between a physical connector system and an IC package-enabled, physical-connectorless external device 282.

Accordingly, a system, device, or method as described above for providing wireless power and data transfer may include one or more of the following examples.

In a first example, an electronic device may include a first dielectric substrate, at least a first electronic circuit supported by the substrate, for processing data, and at least a first communication unit having a first antenna. The first communication unit may be mounted to the substrate in communication with the at least a first electronic circuit for converting between a first EHF electromagnetic signal containing digital information and a first data signal conducted by the at least a first electronic circuit. The first electromagnetic signal may be transmitted or received along a first signal path by the first antenna. A first electromagnetic (EM) signal guide assembly may include a first dielectric element made of a first dielectric material disposed proximate the first antenna in the first signal path. The first EM signal guide may have sides extending along the first signal path. A first sleeve element may extend around the first dielectric element along at least a portion of the sides of the first dielectric element. The first sleeve element may impede transmission of the first EM signal through the sides of the first dielectric element.

The first sleeve element may be made of one or more of an electrically conductive material, an electromagnetically absorptive material, an electromagnetically dissipative material, and a second dielectric material having a dielectric constant that is lower than a dielectric constant of the first dielectric element.

The first sleeve element may be made of the second dielectric material and may have sides extending along the signal path corresponding to the sides of the first dielectric element. The signal guide may include a second sleeve element disposed around the sides of the first sleeve element, and may be made of the electromagnetically dissipative material.

The first communication unit may be a transceiver.

The at least a first communication unit may include a second communication unit having a second antenna. The second communication unit may be mounted to the substrate in communication with the at least a first electronic circuit for converting between a second EHF EM signal containing digital information and a second data signal conducted by the at least a first electronic circuit. The second electromagnetic signal may be transmitted or received along a second signal path by the second antenna. The electromagnetic signal guide assembly may further include a second dielectric element made of a third dielectric material disposed proximate the second antenna in the second signal path and having sides extending along the second signal path. A second sleeve element may extend around the second dielectric element along at least a portion of the sides of the second dielectric element. The second sleeve element may impede transmission of the second electromagnetic signal through the sides of the second dielectric element.

The second sleeve element may be made of a fourth dielectric material having a dielectric constant that is lower than a dielectric constant of the second dielectric element. The second sleeve element may have sides extending along the second signal path corresponding to the sides of the second dielectric element. The signal guide assembly may further include a sleeve assembly disposed around the sides of the first and second sleeve elements, extending continuously between the first and second sleeve elements, and being made of an electrically conductive material.

The first communication unit may be a transmitter and the second communication unit may be a receiver.

An electronic system may include the first electronic device and a second electronic device including a second dielectric substrate, at least a second electronic circuit supported by the second substrate, for processing data, and at least a second communication unit having a second antenna. The second communication unit may be mounted to the second substrate in communication with the at least a second electronic circuit for converting between a second EHF EM signal containing digital information and a second data signal conducted by the at least a second electronic circuit. The second EM signal may be transmitted or received along a second signal path by the second antenna. A second EM signal guide assembly may include a second dielectric element made of a second dielectric material disposed proximate the second antenna in the second signal path and having sides extending along the second signal path. A second sleeve element may extend around the second dielectric element along at least a portion of the sides of the second dielectric element. The second sleeve element may impede transmission of the second electromagnetic signal through the sides of the second dielectric element.

The first communication unit may be a transmitter, and the second communication unit may be a receiver configured to communicate with the first communication unit when the first guide assembly is positioned proximate to and facing the second guide assembly.

The first and second dielectric elements may have corresponding dimensions transverse to the respective first and second signal paths. When the first guide assembly is positioned proximate to and facing the second guide assembly and the second signal path is aligned with the first signal path, the first sleeve element may align with the second sleeve element and the first and second sleeve elements in combination may impede transmission of the first electromagnetic signal through the sides of the first and second dielectric elements.

The first and second sleeve elements may be made of a material that form in combination an electrical, magnetic, or electromagnetic shield extending along the first and second dielectric elements when the first sleeve element is placed against the second sleeve element.

The first and second dielectric elements of the two guide assemblies may have same cross-section dimensions, and the first and second sleeve elements may extend behind the respective first and second communication units.

In a second example, a first electronic connector element may include a first EHF comm-link chip, a first dielectric material encasing the first comm-link chip and extending from the first chip toward a first interface surface spaced from the first comm-link chip. The first comm-link chip may be configured to transmit or receive an electromagnetic signal having a first signal path extending through the dielectric material and the first interface surface. A shielding material may be supported by the dielectric material and may extend from a first side of the first interface surface around the first comm-link chip opposite the first interface surface to a second side of the first interface surface spaced from the first side of the first interface surface. The shielding material may be made of one or more of an electrically conductive material, an electromagnetically absorptive material, and an electromagnetically dissipative material.

The shielding material may form a continuous loop around the interface surface.

The shielding material may be connected to a circuit ground of the first comm-link chip.

The shielding material may be configured to substantially absorb and dissipate EHF radiation that reaches the shielding material from the electromagnetic signal.

A system may include first electronic connector element and a second electronic connector element. The first electronic connector element may further include a first mating element forming at least a portion of the first interface surface. The second electronic connector element may include a second EHF comm-link chip, a second mating surface spaced from the second comm-link chip, and a second mating element forming at least a portion of a second interface surface. The second comm-link chip may be configured to transmit or receive an electromagnetic signal having a second signal path extending through the second interface surface. The first and second mating elements being complementary and including a combination of a recess formed in one of the first and second interface surfaces and a protrusion formed in the other of the first and second interface surfaces, the protrusion being configured to be received in the recess when the first and second interface surfaces are placed in close proximity to each other. The first and second comm-link chips may be configured to communicate an EHF signal between the first electronic connector element and the second electronic connector element.

The first electronic connector element may further include a second dielectric material at least partially surrounding the first dielectric material transverse to the first signal path, The first dielectric material may have a dielectric constant that is substantially higher than a dielectric constant of the second dielectric material.

The first comm-link chip of the first electronic connector may include an integrated circuit (IC), an antenna in communication with the IC, and an insulating material holding the IC and antenna in a fixed location.

The first dielectric material of the first electronic connector element may have a dielectric constant between about 2 and about 5.

In a third example, a system may include a first device and a second device. The first device may include a first electrical circuit and a first electronic connector component having a first dielectric material. A first EHF comm-link chip may be embedded in the first dielectric material and connected to the first electrical circuit for communicating a first electromagnetic signal that propagates along a first signal path passing through the first dielectric material. An electrically conductive shielding layer may extend around at least a portion of the first signal path in the first dielectric material. The second device may include a second electrical circuit and a second electronic connector component having a second dielectric material and a second EHF comm-link chip embedded in the second dielectric material and connected to the second electrical circuit for communicating a second electromagnetic signal that propagates along a second signal path passing through the second dielectric material. The first and second EHF comm-link chips may be configured to communicate with each other when the first and second electronic connector components are positioned with the first dielectric material in contact with the second dielectric material with the first signal path aligned with the second signal path. Communication along the first and second signal paths may occur substantially entirely through the first dielectric material and the second dielectric material.

The electrically conductive shielding layer may be electrically conductive and may be connected to a circuit ground for the first electrical circuit.

The electrically conductive shielding layer may be configured to substantially absorb and dissipate EHF electromagnetic radiation.

A fourth example may include an adapter for interconnecting a first electronic device having a first electrically conductive connector element with a second electronic device having an EHF electromagnetic signal connector element. The adapter may include a dielectric material, an EHF comm-link chip embedded in the dielectric material and configured to communicate the electromagnetic signal with the electromagnetic signal connector element, and a second electrically conductive connector element electrically connected to the comm-link chip and configured to electrically connect to the first electrically conductive connector element.

The adapter may further include a sleeve forming a channel. The comm-link chip may be disposed at a first end of the channel. The sleeve may be sized and configured to receive the electromagnetic signal connector element.

In a fifth example, a system may include a first device and a second device. The first device may include a first EHF comm-link chip assembly configured to transmit a first EHF electromagnetic signal, a first shield partly surrounding the first EHF comm-link chip assembly, and a first circuit in communication with the first EHF comm-link chip assembly. The second device may have a second EHF comm-link chip assembly configured to receive the first EHF electromagnetic signal and a second shield partly surrounding the second EHF comm-link chip assembly. The first and second shields may be configured mutually to create a substantially continuous shield around the first and second EHF comm-link chip assemblies when the first and second devices are aligned.

The first EHF comm-link chip assembly may be in communication with the first circuit and configured to receive a second EHF electromagnetic signal when the first and second devices are aligned. The second device may further include a second circuit, the second EHF comm-link chip assembly being in communication with the second circuit and configured to transmit the second EHF electromagnetic signal.

The first and second devices may be configured such that alignment of the devices results in substantial alignment of the first and second EHF comm-link chip assemblies, and substantial alignment of the first and second EHF comm-link chip assemblies includes both lateral and proximal alignment sufficient to enable adequate signal communication between the first and second EHF comm-link chip assemblies.

The first EHF comm-link chip assembly may include insulating material, an integrated circuit (IC), and an antenna that communicates with the IC and is fixed in location relative to the IC by the insulating material.

INDUSTRIAL APPLICABILITY

The inventions described herein relate to industrial and commercial industries, such as electronics and communications industries using devices that communicate with other devices or devices having communication between components in the devices.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

Although the present invention has been shown and described with reference to the foregoing operational principles and preferred embodiments, it will be apparent to those skilled in the art that various changes in form and detail may be made without departing from the spirit and scope of the invention. The present invention is intended to embrace all such alternatives, modifications and variances that fall within the scope of the appended claims.

We claim:

1. An electronic device comprising:
a first dielectric substrate;
at least a first electronic circuit supported by the substrate, for processing data;
at least a first communication unit having a first antenna, the first communication unit mounted to the substrate in communication with the at least a first electronic circuit for converting between a first EHF electromagnetic signal containing digital information and a first data signal conducted by the at least a first electronic circuit, the first electromagnetic signal transmitted or received along a first signal path by the first antenna; and
a first electromagnetic signal guide assembly including a first dielectric element made of a first dielectric material disposed proximate the first antenna in the first signal path and having sides extending along the first signal path, and a first sleeve element extending around the first dielectric element along at least a portion of the sides of the first dielectric element, the first sleeve element impeding transmission of the first electromagnetic signal through the sides of the first dielectric element.

2. The electronic device of claim 1, wherein the first sleeve element is made of one of an electrically conductive material, an electromagnetically absorptive material, an electromagnetically dissipative material, and a second dielectric material having a dielectric constant that is lower than a dielectric constant of the first dielectric element.

3. The electronic device of claim 2, wherein the first sleeve element is made of the second dielectric material and has sides extending along the signal path corresponding to the sides of the first dielectric element, and the signal guide includes a second sleeve element disposed around the sides of the first sleeve element and made of the electromagnetically dissipative material.

4. The electronic device of claim 1, wherein the first communication unit is a transceiver.

5. The electronic device of claim 1, wherein the at least a first communication unit includes a second communication unit having a second antenna, the second communication unit mounted to the substrate in communication with the at least a first electronic circuit for converting between a second EHF electromagnetic signal containing digital information and a second data signal conducted by the at least a first electronic circuit, the second electromagnetic signal transmitted or received along a second signal path by the second antenna; and
wherein the electromagnetic signal guide assembly further includes a second dielectric element made of a third dielectric material disposed proximate the second antenna in the second signal path and having sides extending along the second signal path, and a second sleeve element extending around the second dielectric element along at least a portion of the sides of the second dielectric element, the second sleeve element impeding transmission of the second electromagnetic signal through the sides of the second dielectric element.

6. The electronic device of claim 5, wherein the second sleeve element is made of a fourth dielectric material having a dielectric constant that is lower than a dielectric constant of the second dielectric element, the second sleeve element having sides extending along the second signal path corresponding to the sides of the second dielectric element, and the signal guide assembly further includes a sleeve assembly disposed around the sides of the first and second sleeve elements, extending continuously between the first and second sleeve elements, and being made of one of an electrically conductive material, an electromagnetically absorptive material, and an electromagnetically dissipative material.

7. The electronic device of claim 5, wherein the first communication unit is a transmitter and the second communication unit is a receiver.

8. An electronic system comprising the electronic device of claim 1 as a first electronic device, the electronic system further comprising a second electronic device including:
a second dielectric substrate;
at least a second electronic circuit supported by the second substrate, for processing data;
at least a second communication unit having a second antenna, the second communication unit mounted to the second substrate in communication with the at least a second electronic circuit for converting between a second EHF electromagnetic signal containing digital information and a second data signal conducted by the at least a second electronic circuit, the second electromagnetic signal transmitted or received along a second signal path by the second antenna; and a second electromagnetic signal guide assembly including a second dielectric element made of a second dielectric material disposed proximate the second antenna in the second signal path and having sides extending along the second signal path, and a second sleeve element extending around the second dielectric element along at least a portion of the sides of the second dielectric element, the second sleeve element impeding transmission of the second electromagnetic signal through the sides of the second dielectric element.

9. The electronic system of claim 8, wherein the first communication unit is a transmitter, the second communication unit is a receiver configured to communicate with the first communication unit when the first guide assembly is positioned proximate to and facing the second guide assembly.

10. The electronic system of claim 9, wherein the first and second dielectric elements have corresponding dimensions transverse to the respective first and second signal paths, and when the first guide assembly is positioned proximate to and facing the second guide assembly and the second signal path is aligned with the first signal path, the first sleeve element aligns with the second sleeve element and the first and second sleeve elements in combination impede transmission of the first electromagnetic signal through the sides of the first and second dielectric elements.

11. The electronic system of claim 10, wherein the first and second sleeve elements are made of a material that forms in combination an electric, magnetic, or electromagnetic shield extending along the first and second dielectric elements when the first sleeve element is placed against the second sleeve element.

12. The electronic system of claim 11, wherein the first and second dielectric elements of the two guide assemblies have same cross-section dimensions, and the first and second sleeve elements extend behind the respective first and second communication units.

13. A first electronic connector element comprising:
a first EHF comm-link chip,
a first dielectric material encasing the first comm-link chip and extending from the first chip toward a first interface surface spaced from the first comm-link chip, the first comm-link chip being configured to transmit or receive an electromagnetic signal having a first signal path extending through the dielectric material and the first interface surface, and
a shielding material supported by the dielectric material and extending from a first side of the first interface surface around the first comm-link chip opposite the first interface surface to a second side of the first interface surface spaced from the first side of the first interface surface, the shielding material being made of one of an electrically conductive material, an electromagnetically absorptive material, and an electromagnetically dissipative material.

14. The first electronic connector element of claim 13, wherein the shielding material forms a continuous loop around the interface surface.

15. The first electronic connector element of 13, wherein the shielding material is electrically conductive and is connected to a circuit ground of the first comm-link chip.

16. The first electronic connector element of claim 13, wherein the shielding material is configured to substantially absorb and dissipate EHF radiation that reaches the shielding material from the electromagnetic signal.

17. A system comprising the first electronic connector element of claim 13 and a second electronic connector element, the first electronic connector element further comprising a first mating element forming at least a portion of the first interface surface, the second electronic connector element comprising a second EHF comm-link chip, a second mating surface spaced from the second comm-link chip and a second mating element forming at least a portion of a second interface surface, the second comm-link chip being configured to transmit or receive an electromagnetic signal having a second signal path extending through the second interface surface, the first and second mating elements being complementary and including a combination of a recess formed in one of the first and second interface surfaces and a protrusion formed in the other of the first and second interface surfaces, the protrusion being configured to be received in the recess when the first and second interface surfaces are placed in close proximity to each other, and the first and second comm-link chips are configured to communicate an EHF signal between the first electronic connector element and the second electronic connector element.

18. The first electronic connector element of claim 13, further comprising a second dielectric material at least partially surrounding the first dielectric material transverse to the first signal path, the first dielectric material having a dielectric constant that is substantially higher than a dielectric constant of the second dielectric material.

19. The first electronic connector element of claim 13, wherein the first comm-link chip includes an integrated circuit (IC), an antenna in communication with the IC, and an insulating material holding the IC and antenna in a fixed location.

20. The first electronic connector element of claim 13, wherein the first dielectric material has a dielectric constant between approximately 2 and approximately 5.

21. A system comprising:
a first device including a first electrical circuit and a first electronic connector component having a first dielectric material, a first EHF comm-link chip embedded in the first dielectric material and connected to the first electrical circuit for communicating a first electromagnetic signal that propagates along a first signal path passing through the first dielectric material, and an electrically conductive shielding layer extending around at least a portion of the first signal path in the first dielectric material; and
a second device including a second electrical circuit and a second electronic connector component having a second dielectric material and a second EHF comm-link chip embedded in the second dielectric material and connected to the second electrical circuit for communicating a second electromagnetic signal that propagates along a second signal path passing through the second dielectric material, the first and second EHF comm-link chips being configured to communicate with each other when the first and second electronic connector components are positioned with the first dielectric material in contact with the second dielectric material with the first signal path aligned with the second signal path, and communication along the first and second signal paths occurs substantially entirely through the first dielectric material and the second dielectric material.

22. The system of claim 21, wherein the electrically conductive shielding layer is a circuit ground for the first electrical circuit.

23. The system of claim 21, wherein the electrically conductive shielding layer is configured to substantially absorb and dissipate EHF electromagnetic radiation.

24. An adapter for interconnecting a first electronic device having a first electrically conductive connector element with a second electronic device having an EHF electromagnetic signal connector element, the adapter including
   a dielectric material;
   an EHF comm-link chip embedded in the dielectric material and configured to communicate the electromagnetic signal with the electromagnetic signal connector element; and
   a second electrically conductive connector element electrically connected to the comm-link chip and configured to electrically connect to the first electrically conductive connector element; and
   further comprising a sleeve forming a channel, the comm-link chip being disposed at a first end of the channel, the sleeve being sized and configured to receive the electromagnetic signal connector element.

25. A system comprising:
   a first device including a first EHF comm-link chip assembly configured to transmit a first EHF electromagnetic signal, a first shield partly surrounding the first EHF comm-link chip assembly, and a first circuit in communication with the first EHF comm-link chip assembly; and
   a second device having a second EHF comm-link chip assembly configured to receive the first EHF electromagnetic signal and a second shield partly surrounding the second EHF comm-link chip assembly; the first and second shields being configured mutually to create a substantially continuous shield around the first and second EHF comm-link chip assemblies when the first and second devices are aligned.

26. The system of claim 25, wherein the first EHF comm-link chip assembly is in communication with the first circuit and configured to receive a second EHF electromagnetic signal when the first and second devices are aligned; the second device further includes a second circuit, the second EHF comm-link chip assembly being in communication with the second circuit and configured to transmit the second EHF electromagnetic signal.

27. The system of claim 25, wherein the first and second devices are configured such that alignment of the devices results in substantial alignment of the first and second EHF comm-link chip assemblies, and substantial alignment of the first and second EHF comm-link chip assemblies includes both lateral and proximal alignment sufficient to enable adequate signal communication between the first and second EHF comm-link chip assemblies.

28. The system of claim 25, wherein the first EHF comm-link chip assembly includes insulating material, an integrated circuit (IC), and an antenna that communicates with the IC and is fixed in location relative to the IC by the insulating material.

* * * * *